(12) United States Patent
Shimazaki

(10) Patent No.: US 10,504,867 B2
(45) Date of Patent: Dec. 10, 2019

(54) SEMICONDUCTOR DEVICE HAVING A BONDING PAD

(71) Applicant: SII Semiconductor Corporation, Chiba-shi, Chiba (JP)

(72) Inventor: Koichi Shimazaki, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/193,386

(22) Filed: Jun. 27, 2016

(65) Prior Publication Data
US 2017/0005024 A1    Jan. 5, 2017

(30) Foreign Application Priority Data
Jun. 30, 2015 (JP) .................. 2015-131484

(51) Int. Cl.
| | |
|---|---|
| *H01L 23/48* | (2006.01) |
| *H01L 23/00* | (2006.01) |
| *H01L 23/31* | (2006.01) |
| *H01L 23/52* | (2006.01) |
| *H01L 29/40* | (2006.01) |

(52) U.S. Cl.
CPC .......... *H01L 24/29* (2013.01); *H01L 23/3157* (2013.01); *H01L 24/05* (2013.01); *H01L 2224/04026* (2013.01); *H01L 2224/29006* (2013.01); *H01L 2224/29013* (2013.01); *H01L 2224/29026* (2013.01)

(58) Field of Classification Search
CPC ..... H01L 23/3171; H01L 24/05; H01L 24/29; H01L 2224/29026; H01L 2224/29006; H01L 2224/29013; H01L 2224/04026; H01L 2224/1302; H01L 2224/141; H01L 2224/161; H01L 2224/171; H01L 2224/2111; H01L 2224/221; H01L 2224/2902; H01L 2224/302; H01L 2224/321; H01L 2224/331
USPC .......................................... 257/774, 784, 786
See application file for complete search history.

(56) References Cited

U.S. PATENT DOCUMENTS

| | | | |
|---|---|---|---|
| 6,611,030 B1* | 8/2003 | Lee ................. | H01L 21/76898 257/369 |
| 7,888,806 B2* | 2/2011 | Lee .................. | H01L 23/522 257/686 |
| 2009/0026635 A1* | 1/2009 | Momono ......... | H01L 21/76838 257/782 |

FOREIGN PATENT DOCUMENTS

| | | |
|---|---|---|
| JP | 62214633 | 9/1987 |
| JP | 3053843 | 5/1991 |

OTHER PUBLICATIONS

Abstract, Publication No. JP 05-226339, Publication date Sep. 3, 1993.

(Continued)

*Primary Examiner* — Kimberly N Rizkallah
*Assistant Examiner* — Dilinh P Nguyen
(74) *Attorney, Agent, or Firm* — Adams & Wilks

(57) ABSTRACT

A semiconductor device has a bonding pad and a wiring layer formed on an insulating film. The wiring layer is spaced from the bonding pad by a gap. A passivation film covers the bonding pad and the wiring layer and fills the gap. The gap has a width equal to or larger than the thickness of the passivation film, and equal to or smaller than twice a side wall thickness of the passivation film covering a side wall of the wiring layer. The semiconductor device has a high resistance to stress during bonding.

14 Claims, 3 Drawing Sheets

(56) References Cited

OTHER PUBLICATIONS

Notification of Reasons for Refusal, dated Feb. 18, 2019 in Japanese Application No. 2015-131484 together with English-language machine translation thereof.

* cited by examiner

SEMICONDUCTOR DEVICE HAVING A BONDING PAD

BACKGROUND OF THE INVENTION

1. Field of the Invention

The present invention relates to a semiconductor device including a bonding pad.

2. Description of the Related Art

As illustrated in FIG. 6, a related-art semiconductor device has the following structure in the vicinity of a bonding pad. Specifically, an insulating film 201 is formed on a semiconductor substrate 101, and a bonding pad 301 is formed on the insulating film 201 with a top wiring layer. Dummy wiring 302 is formed in the vicinity of the bonding pad 301 via a gap. A passivation film 401 for protecting the semiconductor device is formed to have a thickness equal to or larger than a thickness of the bonding pad 301. An opening portion 501 for connecting a bonding wire to the bonding pad 301 is formed on the bonding pad 301 to expose a surface of the bonding pad 301 (for example, see Japanese Patent Application Laid-open No. 05-226339).

It has been known that, in order to prevent a passivation film from cracking by a stress caused during wire bonding or a thermal stress, the strength of a passivation film formed in the vicinity of a bonding pad is increased, thereby enabling cracks in the passivation film to be suppressed.

However, the strength of the passivation film is lowered when the passivation film has a thickness smaller than a thickness of a bonding pad, with the result that the passivation film may crack due to wire bonding or by a thermal stress.

SUMMARY OF THE INVENTION

The present invention has been made in view of the above-mentioned trouble, and has an object to provide a semiconductor device having a high resistance to a stress caused during bonding or a thermal stress even when a passivation film of the semiconductor device has a thickness smaller than that of a bonding pad thereof.

In order to achieve the above-mentioned object, according to one embodiment of the present invention, there is provided a semiconductor device having a feature that a wiring layer is formed in the vicinity of a bonding pad via a gap, a passivation film has a thickness smaller than that of the wiring layer forming the bonding pad, the gap has a width equal to or larger than the thickness of the passivation film, and is equal to or smaller than twice the thickness of the passivation film, and after the passivation film is deposited, a thickness of a portion of the passivation film filled into the gap is larger than that of a portion of the passivation film formed on the bonding pad.

According to the present invention, the passivation film is deposited on the bonding pad so that a thickness of a portion of the passivation film formed on side walls of the bonding pad can be increased, to thereby increase a resistance to a stress caused during bonding.

DETAILED DESCRIPTION OF THE INVENTION

In the following, a first embodiment of the present invention is described with reference to FIG. 1.

Figure 1:
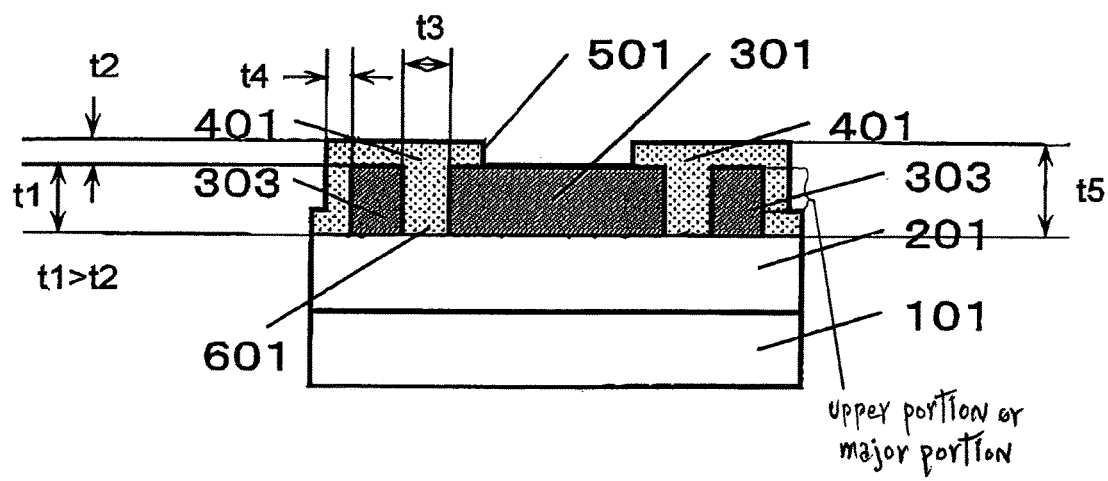
FIG. 1 is a sectional view for illustrating a semiconductor device according to a first embodiment of the present invention.

As illustrated in FIG. 1, a semiconductor device according to the first embodiment has, in a bonding pad and a vicinity thereof, a structure including an insulating film 201 formed on a surface of a semiconductor substrate 101, a bonding pad 301 formed on the insulating film 201, top wiring layers 303 formed in the vicinity of the bonding pad 301 via a gap 601, a passivation film 401 formed on the bonding pad 301 and the wiring layers 303, for protecting the semiconductor substrate 101, and an opening portion 501 through which the bonding pad 301 is exposed so that a bonding wire can be connected thereto.

The top wiring layer 303 may be partially formed along one side of the bonding pad 301 as one line, or may be formed so as to surround the bonding pad 301 as one surrounding member. In FIG. 1, the top wiring layers 303 are formed along two opposite sides of the bonding pad 301, respectively. The top wiring layers 303 have opposite inner and outer side walls, the inner side wall being spaced in a horizontal direction (as viewed in FIG. 1) from the bonding pad 301.

In this case, vertical thicknesses t1 of the top wiring layer 303 and the bonding pad 301 are larger than a vertical thickness t2 of the passivation film 401 formed on the top wiring layers (t1>t2). As shown in FIG. 1, for example, a horizontal width t3 of the gap 601 between the bonding pad 301 and the inner side wall of the top wiring layer 303 is equal to or larger than the vertical thickness t2 of the passivation film 401 formed on the top wiring layers 303 (t3≥t2), and the width t3 of the gap 601 is equal to or smaller than twice a side wall thickness t4 (t3≥t4). The side wall thickness is a horizontal thickness t4 of a portion of the passivation film deposited on side walls of isolated patterns formed of the top wiring layers 303. The horizontal thickness t4 refers to the thickness, in the horizontal direction as viewed in FIG. 1, of the passivation film in the regions covering major portions of the side walls of the top wiring layers 303 that extend from near the bottoms to the top surfaces of the to wiring layers. With the values set as described above, the passivation film 401 is filled into the gap 601 between the bonding pad 301 and the top wiring layer, and a thickness of a portion of the passivation film 401 covering side walls of the bonding pad 301 is larger than that of a portion of the passivation film 401 formed on the bonding pad 301 due to the formation of the top wiring layer 303. Besides, a vertical thickness t5 of the portion of the passivation film 401 covering the side walls of the bonding pad 301 is larger than a vertical thickness t1 of the bonding pad 301.

Other wiring layers may be included in the insulating film 201. Further, a potential of the top wiring layer may be the same potential as or a different potential from that of the bonding pad 301, or may be a floating potential.

Further, although the bonding pad 301 is a rectangle, including a square, in general, other shapes may be adopted. In addition, resin, e.g., polyimide may further be deposited on the passivation film 401.

When wire bonding is performed on the bonding pad 301, the bonding pad 301 is deformed, and a stress is applied to the passivation film 401 from the side walls of the bonding pad 301 in a horizontal direction to press the passivation film 401. However, the portion of the passivation film 401 covering the side walls of the bonding pad 301 is thick, and hence a resistance to a stress caused during bonding is high. It is thus possible to suppress occurrence of cracks in the passivation film 401. In addition, a height of the portion of the passivation film covering the side walls of the bonding pad is uniform, and hence it is also possible to overcome a drawback in the related art that the upper part of the passivation film is liable to be damaged.

Figure 2:
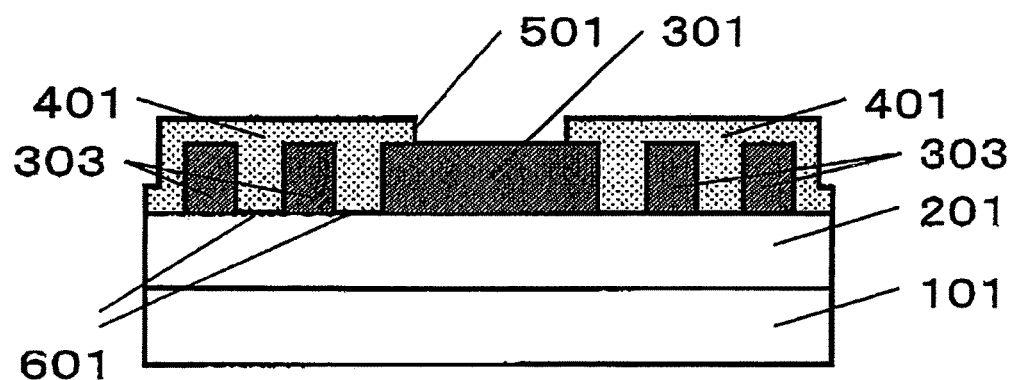
FIG. 2 is a sectional view for illustrating a semiconductor device according to a second embodiment of the present invention.

FIG. 2 is a sectional view for illustrating a semiconductor device according to a second embodiment of the present invention. In the first embodiment, the top wiring layer 303 is formed so as to be adjacent to the bonding pad 301 as one line or one surrounding member. On the other hand, in the second embodiment, the top wiring layers 303 are formed as at least two lines or two surrounding members. With this structure, horizontal thicknesses of the top wiring layers 303 and the portion of the passivation film 401 covering the side walls of the bonding pad 301 are larger than those in the first embodiment, and it is thus possible to more effectively suppress occurrence of cracks in the passivation film 401.

Figure 3:
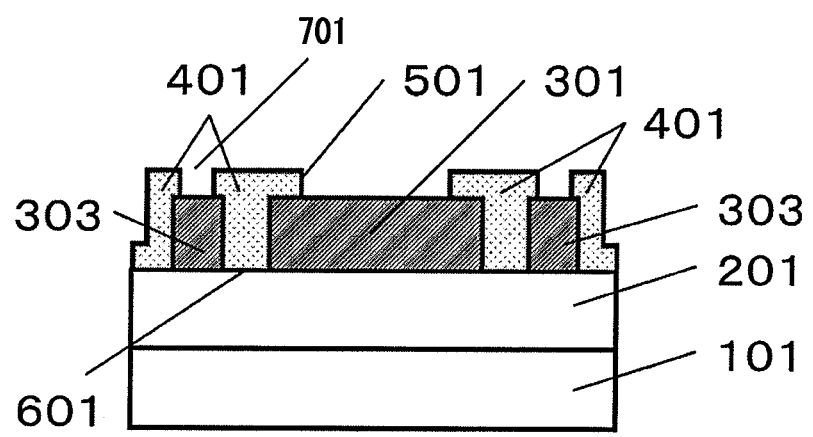
FIG. 3 is a sectional view for illustrating a semiconductor device according to a third embodiment of the present invention.

FIG. 3 is a sectional view for illustrating a semiconductor device according to a third embodiment of the present invention. In the first embodiment, the passivation film 401 formed on the top wiring layer 303 is not divided and covers the top wiring layer 303. On the other hand, in the third embodiment, the passivation film 401 is divided by a slit 701 on part of the top wiring layer 303. That is, on the wiring layer 303, which is not the bonding pad, there is formed a slit that is a region from which the passivation film 401 is removed. A stress caused due to the deformation is alleviated by a slit that is a region dividing the passivation film 401, and it is thus possible to suppress occurrence of cracks in the passivation film 401 also with this structure, as in the first embodiment.

Figure 4:
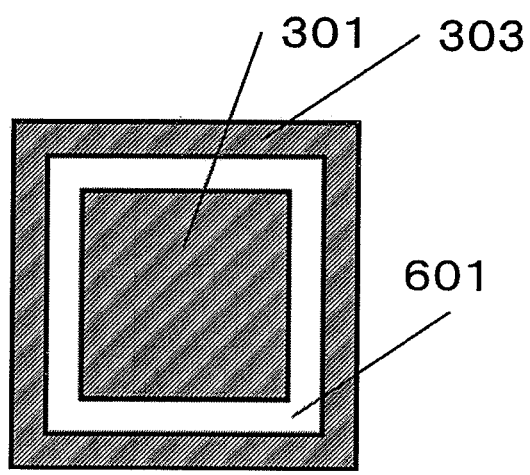
FIG. 4 is a plan view for illustrating a semiconductor device according to a fourth embodiment of the present invention.

FIG. 4 is a plan view for illustrating a semiconductor device according to a fourth embodiment of the present invention. The top wiring layer 303 is not divided and is formed around the bonding pad 301 as one rectangular ring via the gap 601. It is thus possible to suppress occurrence of cracks in the passivation film 401.

Figure 5:
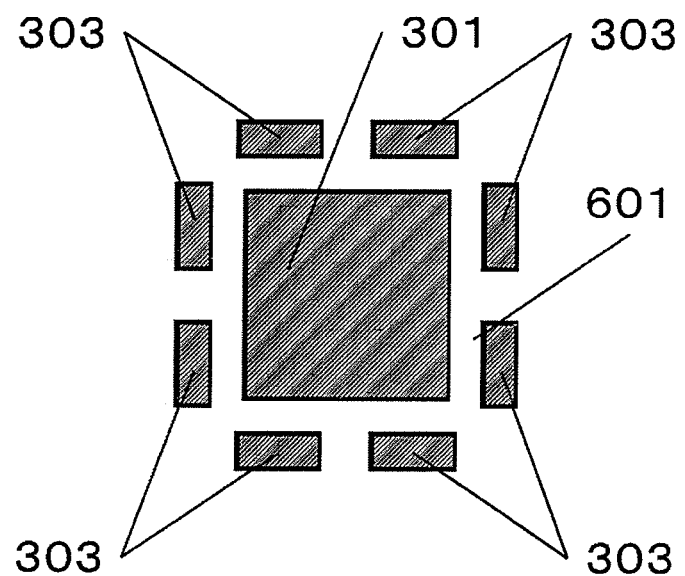
FIG. 5 is a plan view for illustrating a semiconductor device according to a fifth embodiment of the present invention.
Figure 6:
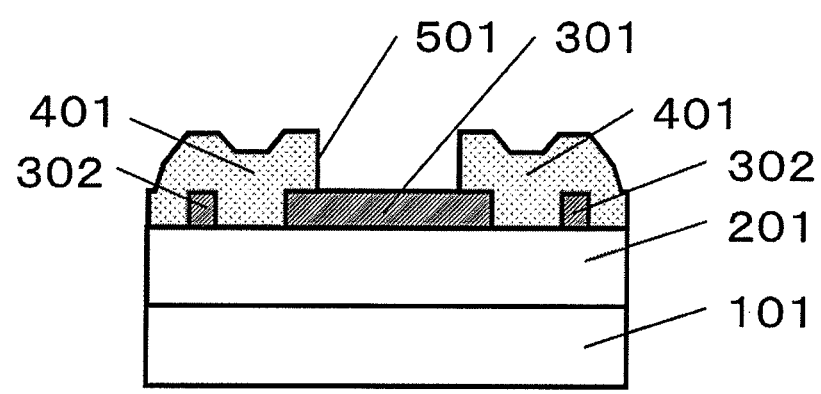
FIG. 6 is a sectional view for illustrating a bonding pad in a related-art semiconductor device.

FIG. 5 is a plan view for illustrating a semiconductor device according to a fifth embodiment of the present invention. The top wiring layer 303 is divided and is formed around the bonding pad 301 as one surrounding member via the gap 601. It is thus possible to suppress occurrence of cracks in the passivation film 401 even when the top wiring layer 303 is divided.

Also in a semiconductor device formed by combining the embodiments illustrated in FIG. 1 to FIG. 5, occurrence of cracks in the passivation film 401 can be similarly suppressed.

What is claimed is:

1. A semiconductor device, comprising:
   a semiconductor substrate;
   an insulating film formed on a surface of the semiconductor substrate;
   a bonding pad formed on the insulating film;
   a top wiring layer, which is not a bonding pad, formed on the insulating film around the bonding pad and spaced in a horizontal direction from the bonding pad by a gap, the top wiring layer having an inner side wall horizontally spaced from and facing the bonding pad and defining therebetween the gap, and an outer side wall opposite the inner side wall; and
   a passivation film formed on and covering the bonding pad and the top wiring layer and having an opening portion that exposes the bonding pad, the passivation film having in a region covering a top surface of the top wiring layer a vertical thickness and having in a region covering a major portion of the outer side wall of the top wiring layer a horizontal thickness, the aforesaid vertical thickness and horizontal thickness being smaller than a vertical thickness of the bonding pad, and the passivation film having a slit that exposes part of the top surface of the top wiring layer formed around the bonding pad, and the passivation film having a slit that exposes part of the top surface of the top wiring layer formed around the bonding pad,
   wherein a width of the slit is smaller than a width of the opening portion, and
   wherein the gap has a width equal to or larger than the vertical and horizontal thicknesses of the passivation film in the regions covering the top surface and the major portion of the outer side wall of the top wiring layer, and equal to or smaller than twice the horizontal thickness of the passivation film covering the major portion of the outer side wall of the top wiring layer.

2. A semiconductor device according to claim 1, wherein the top wiring layer is formed around the bonding pad as a rectangular ring.

3. A semiconductor device according to claim 2, wherein the top wiring layer is divided in part.

4. A semiconductor device according to claim 3, wherein the top wiring layer comprises at least two spaced-apart top wiring layers formed around the bonding pad.

5. A semiconductor device according to claim 2, wherein the top wiring layer comprises at least two spaced-apart top wiring layers formed around the bonding pad.

6. A semiconductor device according to claim 1, wherein a vertical thickness of a portion of the passivation film filled in the gap is larger than a vertical thickness of a portion of the passivation film formed on the bonding pad.

7. A semiconductor device according to claim 1, wherein the thickness of the passivation film formed on the major portion of the outer side wall is substantially the same as the thickness of the passivation film formed on the top surface.

8. A semiconductor device, comprising:
   a semiconductor substrate;
   an insulating film, devoid of through openings, formed on a surface of the semiconductor substrate;
   a bonding pad having uniform thickness formed on the insulating film;
   a top wiring layer, which is not a bonding pad, formed on the insulating film around the bonding pad and spaced from the bonding pad by a gap; and
   a passivation film formed on and covering the bonding pad and the top wiring layer, the passivation film having an opening portion that exposes the bonding pad and having in a region covering a top surface and in a region deposited on a side wall opposite the bonding pad of the top wiring layer a thickness smaller than a thickness of the bonding pad, and the passivation film having a slit that exposes part of the top surface of the top wiring layer formed around the bonding pad, wherein a width of the slit is smaller than a width of the opening portion, and wherein the gap has a width equal to or larger than the thickness of the passivation film in the region covering the top surface and in the region deposited on the side wall opposite the bonding pad of the top wiring layer, and equal to or smaller than twice the thickness of the passivation film deposited on the side wall opposite the bonding pad of the top wiring layer.

9. A semiconductor device according to claim 8, wherein the top wiring layer is formed around the bonding pad as a rectangular ring.

10. A semiconductor device according to claim 9, wherein the top wiring layer is divided in part.

11. A semiconductor device according to claim 10, wherein the top wiring layer comprises at least two spaced-apart top wiring layers formed around the bonding pad.

12. A semiconductor device according to claim 9, wherein the top wiring layer comprises at least two spaced-apart top wiring layers formed around the bonding pad.

13. A semiconductor device according to claim 8, wherein a vertical thickness of a portion of the passivation film filled in the gap is larger than a vertical thickness of a portion of the passivation film formed on the bonding pad.

14. A semiconductor device according to claim 8, wherein the thickness of the passivation film formed on the upper portion of the second side wall is substantially the same as the thickness of the passivation film formed on the top surface.

* * * * *